US011131017B2

United States Patent
Brozell et al.

(10) Patent No.: US 11,131,017 B2
(45) Date of Patent: Sep. 28, 2021

(54) VAPORIZED METAL APPLICATION HOOD

(71) Applicant: Owens-Brockway Glass Container Inc., Perrysburg, OH (US)

(72) Inventors: Brian J Brozell, Maumee, OH (US); Brian J. Chisholm, Sylvania, OH (US); Frederic Jolly, Auberives-sur-Vareze (FR)

(73) Assignee: Owens-Brockway Glass Container Inc., Perrysburg, OH (US)

( * ) Notice: Subject to any disclaimer, the term of this patent is extended or adjusted under 35 U.S.C. 154(b) by 223 days.

(21) Appl. No.: 16/104,404

(22) Filed: Aug. 17, 2018

(65) Prior Publication Data

US 2020/0056280 A1 Feb. 20, 2020

(51) Int. Cl.
*C23C 14/24* (2006.01)
*C03C 17/09* (2006.01)
*C23C 14/18* (2006.01)

(52) U.S. Cl.
CPC .............. *C23C 14/24* (2013.01); *C03C 17/09* (2013.01); *C23C 14/18* (2013.01); *C03C 2217/262* (2013.01); *C03C 2218/151* (2013.01)

(58) Field of Classification Search
CPC ....... C03C 17/09; C03C 17/005; C03C 17/06; C03C 2218/151; C03C 2218/15; C03C 2217/262; C03C 2217/75; C03C 2217/263; C03C 2217/576
See application file for complete search history.

(56) References Cited

U.S. PATENT DOCUMENTS

| | | | |
|---|---|---|---|
| 3,688,737 A | 9/1972 | Augustsson et al. | |
| 3,690,289 A * | 9/1972 | Frank ..................... | B05B 16/95 118/720 |
| 3,819,404 A | 6/1974 | Scholes et al. | |
| 3,854,918 A | 12/1974 | McKinstry | |
| 3,876,410 A * | 4/1975 | Scholes ................. | C03C 17/005 65/60.52 |
| 3,933,457 A | 1/1976 | Scholes | |
| 4,220,118 A * | 9/1980 | Levene ............... | B05B 13/0278 118/720 |
| 4,349,370 A | 9/1982 | Terneu | |

(Continued)

FOREIGN PATENT DOCUMENTS

| EP | 0187515 A1 | 7/1986 |
|---|---|---|
| EP | 0494495 A1 | 7/1992 |

(Continued)

OTHER PUBLICATIONS

Gulbrandsen, GE—Series of Monobutyltin Trichloride Hot End Coating Equipment, GE48—Installation, Operation, and Maintenance Manuel, Jul. 7, 2015, 40 pages.

(Continued)

*Primary Examiner* — Keath T Chen

(57) ABSTRACT

A hood for depositing vaporized metals on glass container surfaces includes a vaporized metal source that produces vaporized metal; an enclosure, receiving one or more glass containers, comprising at least one side wall and at least one center section having a top above the glass containers; and one or more conduits that fluidly communicate the vaporized metal to an opening in at least one of the top of the center section and the side wall using one or more conduit fans.

17 Claims, 6 Drawing Sheets

(56) References Cited

U.S. PATENT DOCUMENTS

| | | | |
|---|---|---|---|
| 4,668,268 A * | 5/1987 | Lindner | B05B 16/95 |
| | | | 65/60.1 |
| 5,081,953 A | 1/1992 | Guthrie et al. | |
| 5,140,940 A | 8/1992 | Lindner | |
| 5,453,304 A * | 9/1995 | Scholes | B05B 5/025 |
| | | | 427/469 |
| 5,454,873 A | 10/1995 | Scholes et al. | |
| 5,584,903 A | 12/1996 | Guthrie et al. | |
| 5,599,369 A * | 2/1997 | Townsend | C03C 17/005 |
| | | | 118/602 |
| 8,541,055 B2 | 9/2013 | Kutilek et al. | |
| 9,162,780 B2 | 10/2015 | Brozell et al. | |
| 2011/0294645 A1 | 12/2011 | Kim et al. | |
| 2012/0282402 A1* | 11/2012 | Neal | C23C 14/30 |
| | | | 427/255.5 |
| 2015/0101537 A1 | 4/2015 | Fahey | |

FOREIGN PATENT DOCUMENTS

| | | |
|---|---|---|
| ES | 2327476 | 8/2010 |
| GB | 1180131 | 2/1970 |
| WO | WO2013/163055 A1 | 10/2013 |
| WO | WO2014/177651 A1 | 11/2014 |
| WO | WO2017/182409 A1 | 10/2017 |

OTHER PUBLICATIONS

PCT International Search Report and Written Opinion, Int. Serial No. PCT/US2019/042196, Int. Filing Date: Jul. 17, 2019, Applicant: Owens-Brockway Glass Container Inc., dated Oct. 22, 2019.

\* cited by examiner

VAPORIZED METAL APPLICATION HOOD

TECHNICAL FIELD

The present disclosure relates to an apparatus that applies coatings to glass containers and, more particularly, to an apparatus capable of applying vaporized metal to the top sealing surface of a glass container.

BACKGROUND

Glass container production often involves treating the containers to improve their performance in various ways. For instance, vaporized tin is commonly applied to the sides of glass containers as part of the manufacturing process. This process can be included in the "hot end" portion of glass container production. In the past, the glass containers could be placed in an enclosed hood that directs vaporized tin toward the side of the containers from a position located below the openings of those containers. The enclosed hood would also direct the vaporized tin away from the openings of the glass containers using a downwardly facing fan that prevented the formation of tin on the threads of the container openings thereby reducing the amount of torque needed to remove enclosures sealing the openings.

Sometimes it may be beneficial to apply vaporized metal to the top of glass container openings. Existing enclosed hoods can be manipulated to apply vaporized metal to the top of glass containers by turning off the downwardly facing fan and significantly increasing the amount of vaporized metal within the enclosed hood. But this increases the amount of vaporized metal used as part of the process of applying metal oxide to the top of a glass container and also generates additional chlorine gas.

SUMMARY OF THE DISCLOSURE

In one embodiment, a hood for depositing vaporized metals on glass container surfaces includes an evaporator that produces vaporized metal; an enclosure, receiving one or more glass containers, comprising at least one side wall and at least one center section having a top above the glass containers; and one or more conduits that fluidly communicate the vaporized metal to an opening in at least one of the top of the center section and the side wall using one or more conduit fans.

In another embodiment, a hood for depositing vaporized metals on glass container surfaces includes an evaporator that produces vaporized metal; an enclosure, receiving one or more glass containers, comprising at least one side wall and at least one center section having a top above the glass containers; one or more conduits that fluidly communicate the vaporized metal to an opening in at least one of the top of the center section and the side wall; one or more fans that direct the vaporized metal to at least one of a top surface and a side surface of the glass container(s); and a downwardly-facing finish fan carried by the center section of the enclosure.

BRIEF DESCRIPTION OF THE DRAWINGS

The disclosure may best be understood from the following description, the appended claims, and the accompanying drawings, in which:

DETAILED DESCRIPTION

A vaporized metal application hood may generally include a source of vaporized metal as well as a downwardly facing finishing fan that directs a flow of air through a center-section toward the top of glass containers. In addition, the vaporized metal application hood can also include one or more conduits that receive vaporized metal from a source and direct the vaporized metal to a location above a glass container where it is then deposited on a top surface of the glass container. The conduit(s) may include one or more circulation fans that can draw vaporized metal from the source and direct the vaporized metal at the top surface of the glass container at a desired rate. These conduits can also direct the vaporized metal at the side of the glass container, depending on the arrangement of various components in the vaporized metal application hood. These conduits may be opened or closed using valves that selectively communicate the vaporized metal to the top surface or the side surface of the glass container.

It can be desired to have conduits that can deliver vaporized metal through different locations in the vaporized metal application hood, for example through the top, sides, or both. The vaporized metal application hood can include multiple conduits, fans, valves, and/or various other equipment to control where the vaporized metal is applied on the glass container. The vaporized metal application hood can then be reconfigured by opening the valves to process glass containers that are designed to receive a layer of vaporized metal on the top portion. Depending on the position of the valves that allow or restrict the flow of vaporized metal through the conduits, the vaporized metal application hood can process variations in tin application.

The present vaporized metal will be described in terms of vaporized tin. However, other types of vaporized metal could be used with the vaporized metal application hood. Extra vaporized tin can be added to the top surface of a glass container opening to prevent sodium migration from the glass, which may weaken a foil-to-glass seal created between a foil enclosure and the glass.

Figure 1:
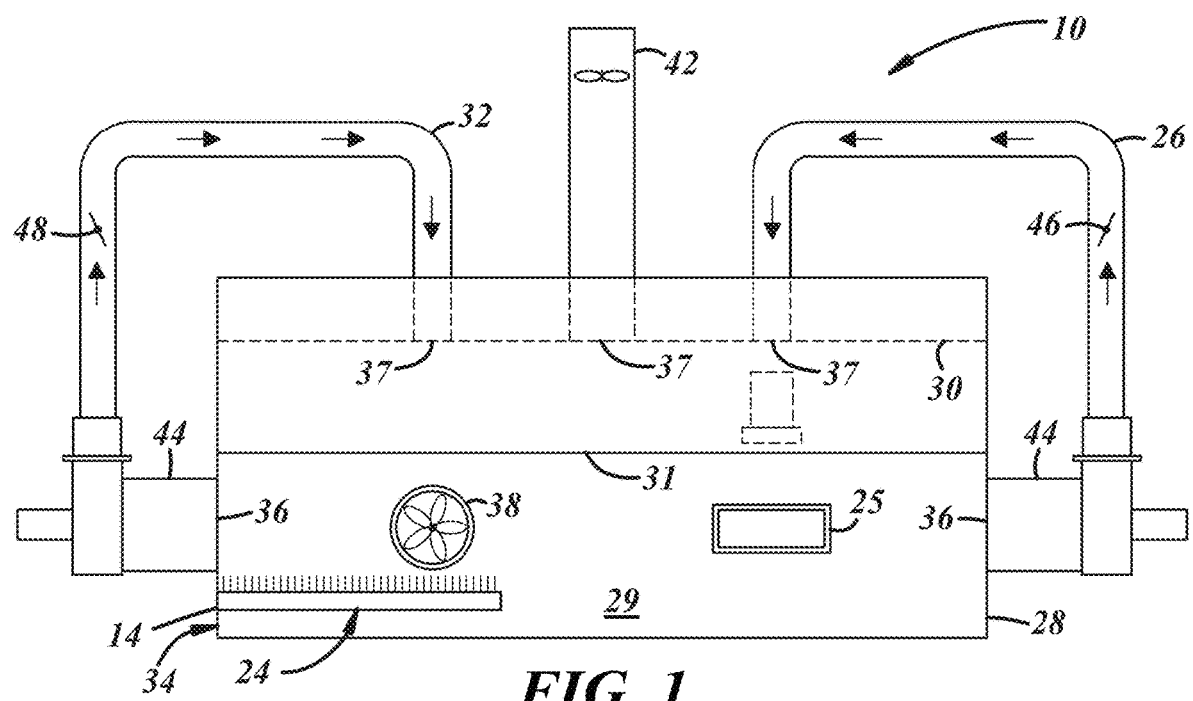
FIG. 1 is a profile view depicting an embodiment of a vaporized metal application hood.
Figure 2:
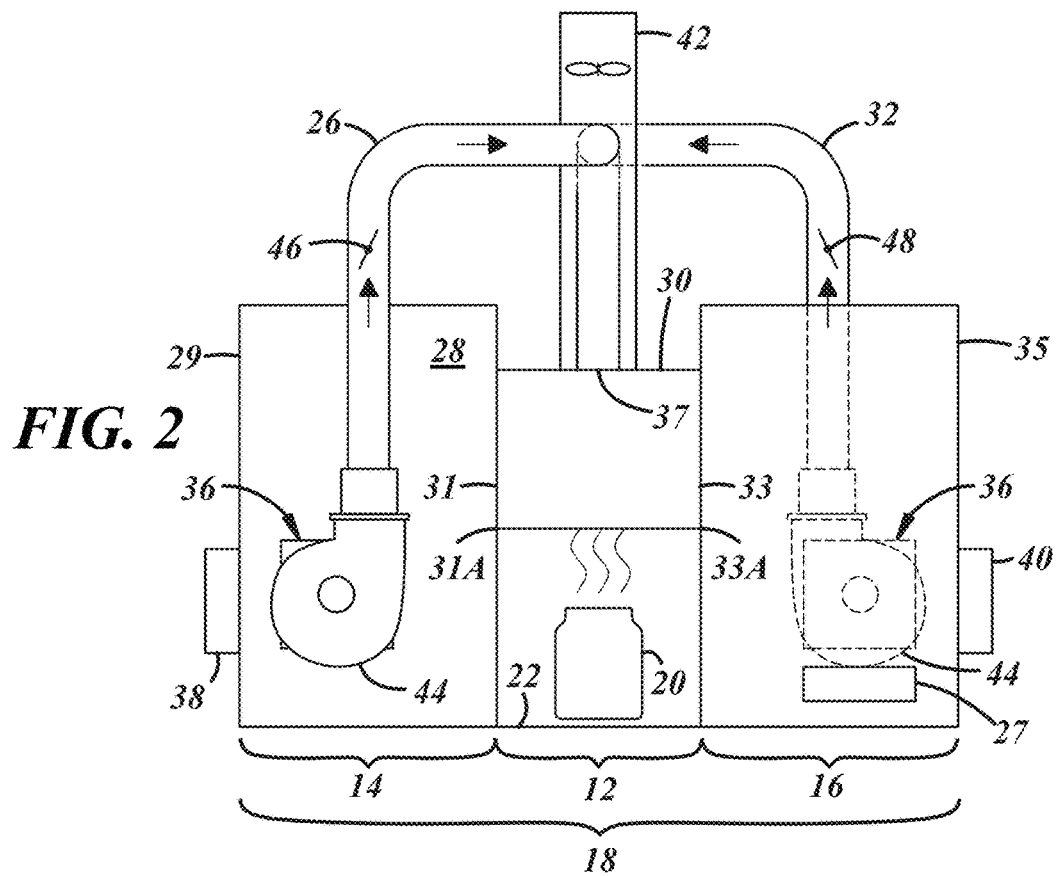
FIG. 2 is another profile view depicting an embodiment of a vaporized metal application hood.
Figure 3:
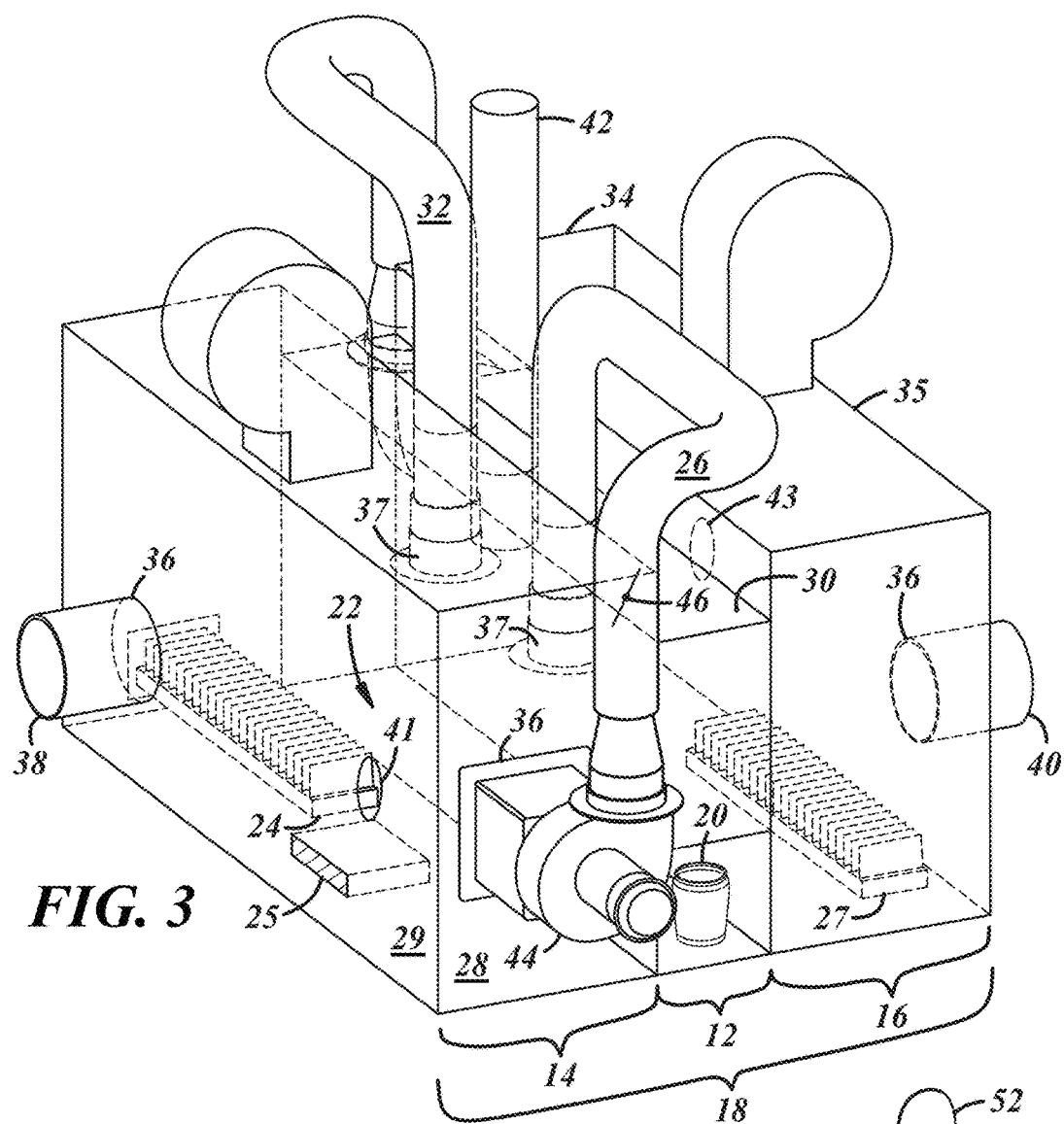
FIG. 3 is a perspective view depicting an embodiment of a vaporized metal application hood.

One embodiment of a vaporized metal application hood 10 is shown in FIGS. 1-3. The vaporized metal application hood 10 shown in the figures includes a main hood section 12 along with a first hood section 14 and a second hood section 16. The main hood section 12, the first hood section 14, and the second hood section 16 collectively form an enclosure 18 in which vaporized metal is contained and applied to glass containers 20. The first hood section 14 and the second hood section 16 can be attached to opposite sides of the main hood section 12. A container path 22 can lead from one end of the main hood section 12 to another end of the main hood section 12 and transport glass containers 20 through the enclosure 18. A vaporized metal source may be located in the first hood section 14, the second hood section 16, or both at various locations. A first conduit 26 can selectively communicate vaporized metal from an opening 36 in a side wall 28 of the first hood section 14 through a top of a center section plenum 30 of the main hood section 12, and a second conduit 32 can communicate vaporized metal from an opening 36 in a side wall 34 of the second hood section 16 through the top of the center section plenum 30 of the main hood section 12 where the vaporized metal is applied to the top of glass container openings. The center section plenum 30 (or simply "center section") can include a first plenum wall 31 and a second plenum wall 33 that extend downward into the enclosure 18 and along the container path 22.

The first plenum wall 31 can have a lower portion 31A and the second plenum wall 33 can have a lower portion 33A. The first and second plenum walls 31, 33 can terminate at their respective lower portions 31A, 33A so that these portions are an end of the respective walls 31, 33. The first plenum wall 31 and a second plenum wall 33 can act as baffles that direct air the length of the center section 30. The first conduit 26 and the second conduit 32 can each feed into separate openings 37 in the top of the center section 30 or can feed into a common opening in the top of the center section 30.

In a typical hood, the hood's center section is usually only one-fourth (¼) of an inch to three-eighths (⅜) of an inch above the top of the container to be coated. In the vaporized metal application hood 10, the top of the center section plenum 30 can be raised to be about 2 to about 4 inches, including all ranges, subranges, and values therebetween, above the top of the glass container 20 to give additional volume for the vaporized metal to accumulate above the glass container 20. For purposes of this disclosure, "approximately" or "about" means that a given quantity is within 10%, preferably within 5%, more preferably within 1%, of a comparison value (e.g., the top of the center section plenum 30 can be within 1% of 2 inches above the top of the glass container 20). Alternatively, the top of the center section plenum 30 can be even higher above the top of the glass container 20 so that the respective lower portions 31A, 33A of the first and second plenum walls 31, 33 are about 2 to about 4 inches, including all ranges, subranges, and values therebetween, above the top of the glass container 20. In particular, the vaporized metal can accumulate in the volume above the glass container 20 and be deposited on a top of a neck finish of the glass container 20. The deposition of the vaporized metal on the top of the neck finish can strengthen the foil-to-glass seal created with a foil enclosure.

It is also possible for the first and second conduits 26, 32 to be configured such that they communicate vaporized metal from the openings 36 in the side walls 28, 34 of the first and second hood sections 14, 16, respectively, and, alternatively or additionally, through additional openings or bores 41, 43 in adjacent side walls 29, 35. More specifically, the first conduit 26 can communicate vaporized metal from the opening 36 in a first side wall 28 and through a first bore 41 in a first adjacent side wall 29. Additionally, the second conduit 32 can communication vaporized metal from the opening 36 in a second side wall 34 and through a second bore 43 in a second adjacent side wall 35. As shown in FIG. 3, the first bore 41 is positioned across the container path 22 from a side, or recirculation, fan 40, and the second bore 43 is positioned across the container path 22 from a side, or recirculation, fan 38. It will be appreciated that while the bores 41, 43 are positioned across from the side fans 40, 38, respectively, the bores 41, 43 could be located anywhere along the side walls 29, 35, respectively, for example, to align with other components in the hood 10. The side fans 38, 40 will be discussed in further detail below.

By controlling the various fans, valves, and other equipment in the vaporized metal application hood 10, any of the conduits described herein can deliver the vaporized metal to any location on the glass container 20, for example, the side, top, or both. For example, any conduits or fans can be controlled to allow vaporized metal to accumulate on at least one of the side and neck finish of the glass container 20. Control of the fans, valves, and other equipment will be discussed further below.

The vaporized metal application hood 10 includes one or more fans that are used to control the application of vaporized metal on the glass containers 20. The first hood section 14 and the second hood section 16 may each include one or more side fans that can direct vaporized metal horizontally toward the container path 22 and the glass containers 20 to apply metal oxides on at least one of the side and neck finish of the glass containers 20. More specifically, a first side fan 38 is located in the adjacent side wall 29 of the first hood section 14 and a second side fan 40 is located in the adjacent side wall 35 of the second hood section 16. These fans can each be activated to selectively direct vaporized metal toward the container path 22. A downwardly-facing finish fan 42 can be positioned in the top of the center section 30 of the main hood section 12 above the container path 22 to direct ambient air on top of glass containers 20 passing below the finish fan 42. The finish fan 42 can be used to minimize or eliminate the formation of metal oxides on the threads of the glass containers 20. Additionally or alternatively, the side fans 38, 40 can be utilized to direct vaporized metal towards the top of the glass container 20.

In addition to the first and second side fans 38, 40 directing the vaporized metal horizontally toward the container path 22, they could also pull the vaporized metal horizontally away from the container path 22. In other words, the first and second side fans 38, 40 could be operated to spin in the opposite direction and suck or pull air and the vaporized metal away from the container path 22. In this mode of operation, the first and second side fans 38, 40 can act as recirculation fans and assist in recirculating the vaporized metal into various parts of the hood 10.

In addition, vaporized metal can be moved through the first conduit 26 and the second conduit 32 in response to the operation of conduit fans 44 that draw vaporized metal from the side wall 28 of the first conduit section 14 and/or the side wall 34 of the second conduit section 16 and convey the vaporized metal through the top of the center section 30 of the main hood section 12 at a location above the glass containers 20 where the vaporized metal is applied to form metal oxide on a top surface of the glass containers 20 through opening(s) 37 into the center section 30. The flow of vaporized metal through the first conduit 26 and the second conduit 32 can be controlled by using variable frequency drive (VFD) to control motor speed of the conduit fans 44. However, the conduit fans 44 can also be implemented without VFD. For instance, in one implementation, a first valve 46 can be located anywhere along the first conduit 26 between and including the side wall 28 of the first hood section 14 and the top wall 30 of the main hood section 12. And a second valve 48 can be located anywhere along the second conduit 32 between and including the side wall 34 of the second hood section 16 and the top wall 30 of the main hood section 12. It is possible to implement the first valve 46 or second valve 48 as an air duct damper or volume control damper (VCD) such that the flow of vaporized metal through the first conduit 26 or second conduit 32 is stopped when the first valve 46 or second valve 48 is closed and permitted when the first valve 46 or second valve 48 is open. There are many types of valve designs that can be used to implement the control of vaporized metal flow that would be recognized by those skilled in the art.

The first conduit 26 and the second conduit 32 can each be made of different materials, cross-sectional shapes, and lengths. The first conduit 26 and the second conduit 32 are shown in the figures as having a generally circular cross-sectional shape, however, the cross-sectional shapes could be oval, rectangular, square, or any other shape able to flow vaporized metal. It should also be recognized that the first conduit 26 and second conduit 32 could be made of metal, a temperature and chemically-resistant plastic, or any other material(s) suitable for use in a glass container coating system. And the shape of the first conduit 26 and the second conduit 32 could be configured based on different design objectives, such as minimizing the accumulation of vaporized metal within the first conduit 26 and the second conduit 32 or minimizing the overall size of the vaporized metal application hood 10.

The enclosure 18 includes the main hood section 12 within which vaporized metal is directed and applied to the surface of the glass containers 20. The enclosure 18 includes a first enclosure heater 24 and a second enclosure heater 27 that heats the air within the enclosure 18 and an evaporator 25 that creates vaporized metal within the enclosure. The vaporized metal source can be a part of the evaporator 25, or the vaporized metal source can be separate from the evaporator 25 and in communication with the evaporator 25 such that liquid metal contacts the evaporator 25. The heaters 24, 27 may use convection, radiant, or any other heating mechanism.

In one implementation, the first enclosure heater 24 can be located in the first hood section 14 while the second enclosure heater 27 can be located in the second hood section 16. The evaporator 25 may be implemented as a heated plate located within the enclosure 18. When a liquid form of the metal to be vaporized is dripped on the evaporator plate 25 (in this implementation, tin, or Monobutyltin Trichloride (MBTC)), the liquid is converted to vapor contained within the vaporized metal application hood 10. As the vaporized tin is generated, one or more glass containers 20 can be moved into the main hood section 12 along the container path 22 where the vaporized tin is applied to a portion of the glass containers 20 depending on how the vaporized metal application hood 10 is configured. When the first valve 46 and the second valve 48 are in a closed position and/or the conduit fans 44 are turned off, the first side fan 38 and/or the second side fan 40 are activated and the vaporized tin is applied to the sides of glass containers 20 moving along the container path 22. The finish fan 42 may also be activated to direct the vaporized tin away from the top surface of the glass container opening.

Figure 4:
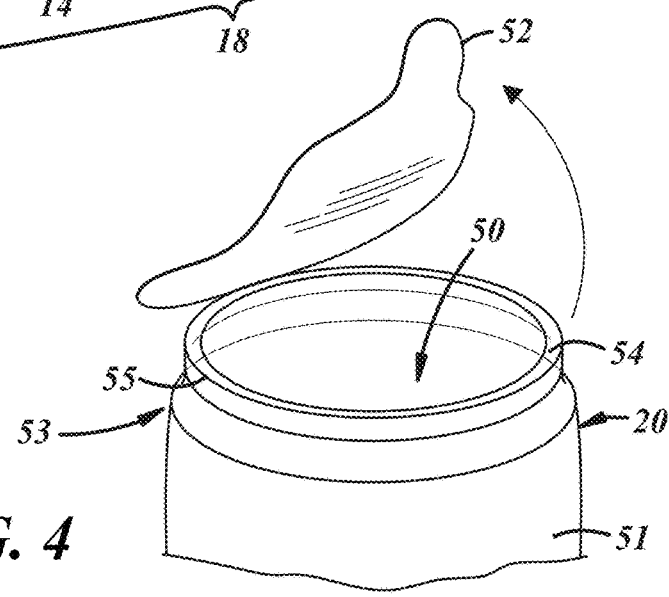
FIG. 4 is a perspective view depicting a portion of one embodiment of a glass container.

However, the vaporized metal application hood 10 can also be used to process other types of glass containers that would benefit from the application of tin on a top surface of an opening of a glass container. The top surface of a glass container opening for such a glass container 20 is shown in FIG. 4 in more detail. For example, a glass container opening 50 may be sealed with a foil enclosure 52 that is sealably-attached to a top surface 54 of the glass container 20 opening thereby sealing the glass container opening 52. A side 51 of the glass container 20 can extend to a shoulder portion 53 of the glass container 20. The shoulder portion 53 can taper to a neck that is attached to a neck finish 55 of the glass container 20. The top surface 54 of the neck finish 55 can contact the foil enclosure 52. Depending on the specific type of glass container 20, the above parts can be larger or smaller than depicted in FIG. 4. For example, the neck and/or the neck finish 55 can be longer or shorter, and the neck finish 55 can include a collar or threads.

The top surface 54 of the glass container opening 50 may be treated with vaporized tin to increase the adhesion between the foil enclosure 52 and the top surface 54 of the glass container 20. These types of glass containers 20 can receive vaporized tin on the top surface 54 of the glass container opening 52 by configuring the vaporized metal application hood 10 to deactivate the first side fan 38, the second side fan 40, and the finish fan 42 while activating the conduit fans 44 of the vaporized metal application hood 10 shown in FIGS. 1-3.

In some implementations, it is possible to have different combinations of fans operating. For example, the first side fan 38 and the second side fan 40 could be activated at the same time as the conduit fans 44. As tin is vaporized and glass containers 20 pass along the container path 22, the conduit fans 44 draw vaporized tin from openings 36 in the side wall 28 of the first conduit section 14 and the side wall 34 of the second conduit section 16 through the first conduit 26 and the second conduit 32 and deposit the vaporized tin through openings 37 in the top of the center section 30 of the main hood section 12. The openings 37 in the top of the center section 30 can be located directly above the container path 22 so that as the glass containers 20 travel along the container path 22 the vaporized tin is aimed toward the top surface of the glass container opening. The vaporized tin can impinge on the top surface 54 and form a coating of metal oxide.

Figure 4A:
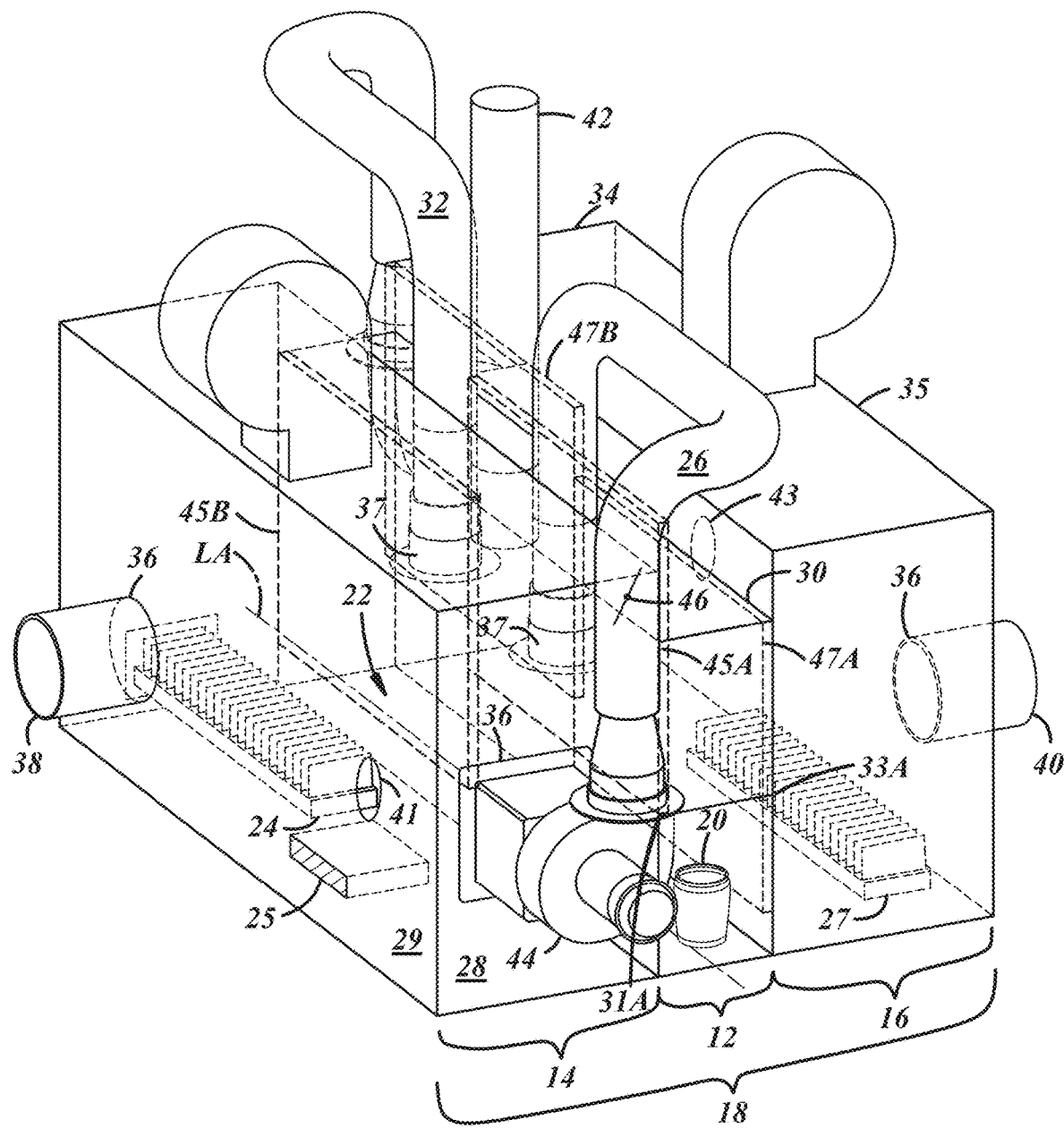
FIG. 4A is a perspective view depicting an embodiment of a vaporized metal application hood with one or more side shields therein.
Figure 4B:
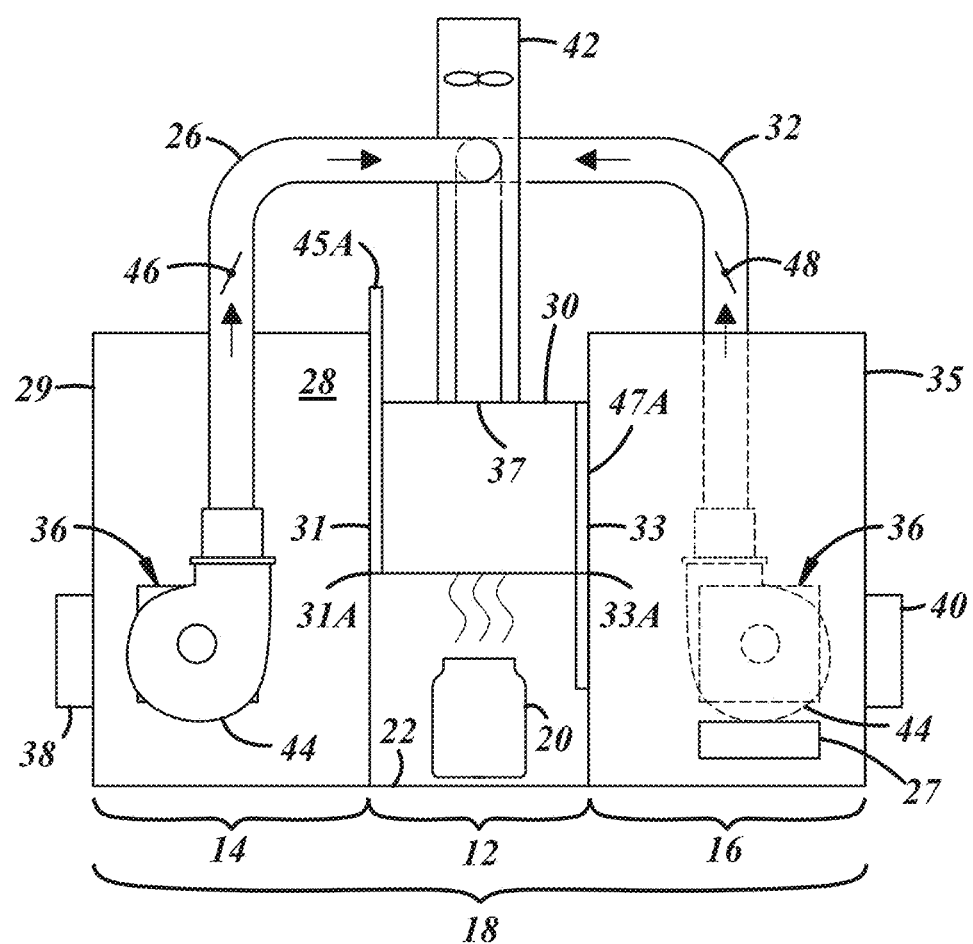
FIG. 4B is a profile view depicting the one or more side shields of FIG. 4A.

FIGS. 4A-B depicts another embodiment, in which the components of the vaporized metal application hood 10 are the same as shown in FIGS. 1-3, with the addition of one or more side shields. For example, first and second side shields 45A-B can be located along the container path 22, parallel to its longitudinal axis LA. Third and fourth side shields 47A-B can also be located along the container path 22, parallel to the longitudinal axis LA, and across the container path from the first and second side shields 45A-B. In this way, the first and second side shields 45A-B are located adjacent and/or in direct contact with the first conduit section 14 and the third and fourth side shields 47A-B are located adjacent and/or in direct contact with the second conduit section 16. The one or more side shields could be positioned in the main hood section 12.

The side shields 45A-B and 47A-B can all be generally square or rectangular plates such that they have equal dimensions. They can also be other shapes as well, including having circular or other polygon cross-sections. While they can all have generally the same dimensions, they can be positioned such that the first and fourth side shields 45A and 47B are positioned higher in the vaporized metal application hood 10 than the second and third side shields 45B and 47A. The lower second and third side shields 45B and 47A can be paired with the higher first and fourth side shields 45A and 47B so that the first side shield 45A is spaced across the container path 22 from the third side shield 47A and the second side shield 45B is spaced across the container path 22 from the fourth side shield 47B. While only two pairs of side shields are depicted in FIG. 4A, other numbers of pairs are possible, such as three, four, five, and so on.

Additionally, the lower second and third side shields 45B and 47A can be positioned adjacent, next to, or in close proximity with the side fans 38, 40, respectively. The lower second and third side shields 45B and 47A can each have a bottom surface that is approximately 3 inches below either of the top of the center section 30 of the main hood section 12 or the lower portion 31A of the first plenum wall 31 and/or approximately ½ inch below the top surface 54 of the glass container opening 52. The higher first and fourth side shields 45A and 47B can each have a bottom surface that does not extend below either of the top of the center section 30 of the main hood section 12 or the lower portion 31A of the first plenum wall 31. For example, the bottom surfaces of the respective first and fourth side shields 45A and 47B can be is aligned with the lower portion 31A of the first plenum wall 31 and the lower portion 33A of the second plenum wall 33, respectively. This may be best seen in FIG. 4B.

In one illustrative method of operation, the glass container 20 can enter the main hood section 12. The vaporized metal can be directed toward the glass container 20 through the bore 41 and towards the side fan 40. The side fan 40 can recirculate any excess vaporized metal after it passes by the container 20. The vaporized metal will first pass by the first side shield 45A. Because the first side shield 45A is positioned entirely above the glass container 20, it will not impede the flow of the vaporized metal toward the glass container 20 and will allow the vaporized metal to accumulate around the glass container 20, particularly in the area of the neck finish 55. As the vaporized metal travels towards the lower third side shield 47A, the position of this side shield will impede the vaporized metal and allow it to accumulate around the glass container 20, particularly in the area of the neck finish 55. The excess vaporized metal will travel below the bottom surface of the third side shield 47A in order to continue to the side, or recirculation, fan 40.

A similar flow path can also occur farther down the container path 22. The vaporized metal can again be directed toward the glass container 20 through the bore 43 and towards the side, or recirculation, fan 38. The vaporized metal will first pass by the fourth side shield 47B. Because the fourth side shield 47B is positioned entirely above the glass container 20, it will not impede the flow of the vaporized metal toward the glass container 20 and will allow the vaporized metal to accumulate around the glass container 20, particularly in the area of the neck finish 55. As the vaporized metal travels towards the lower second side shield 45B, the position of the lower second side shield 45B will impede the vaporized metal and allow it to accumulate around the glass container 20, particularly in the area of the neck finish 55. The excess vaporized metal will travel below the bottom surface of the second side shield 45B in order to continue to the side, or recirculation, fan 38.

Figure 5:
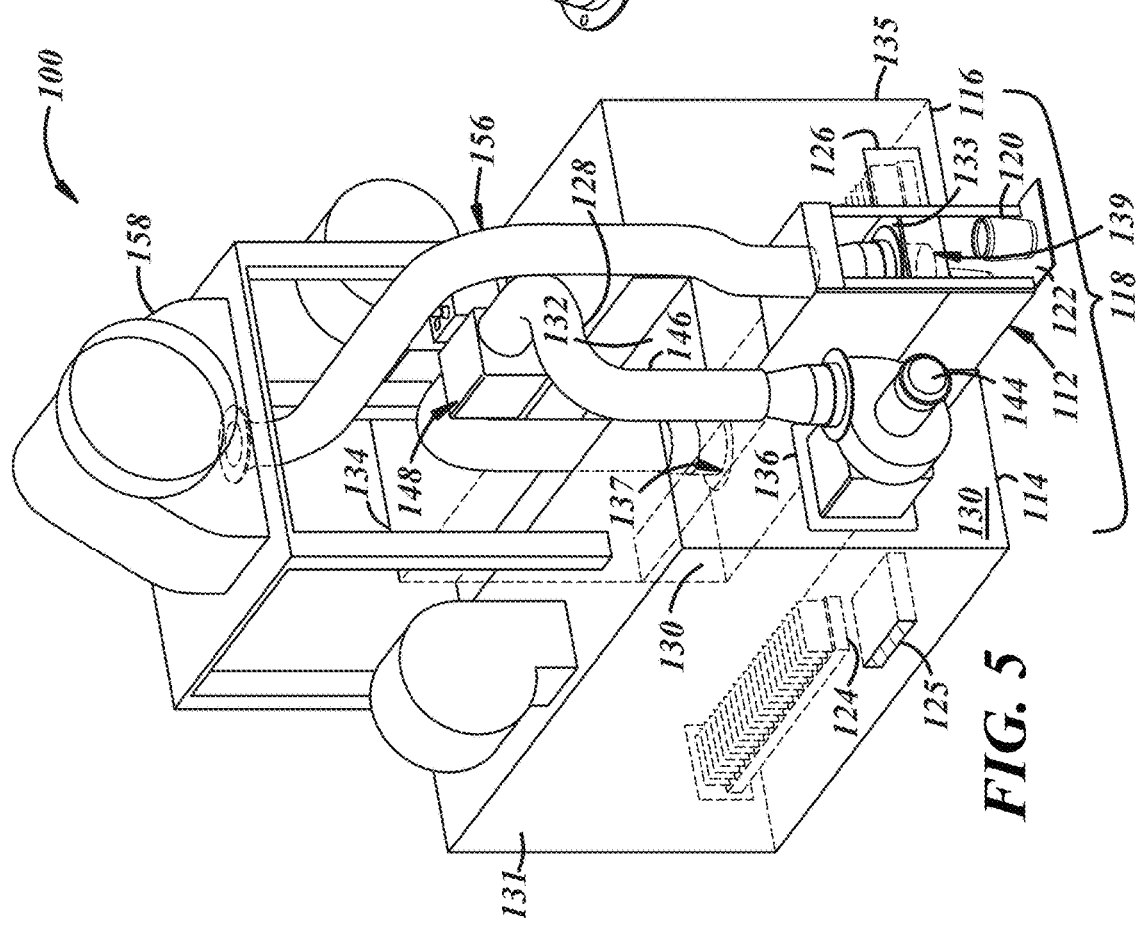
FIG. 5 is a perspective view depicting an embodiment of a vaporized metal application hood.

Turning to FIG. 5, another embodiment of a vaporized metal application hood 100 is shown. The vaporized metal application hood 100 may include a main hood section 112 along with a first hood section 114 and a second hood section 116. The main hood section 112, the first hood section 114, and the second hood section 116 collectively may form an enclosure 118 in which vaporized metal is contained and applied to glass containers 120. The first hood section 114 and the second hood section 116 can be attached to opposite sides of the main hood section 112 and a container path 122 can lead from one end of the main hood section 112 to another end of the main hood section 112 and transport glass containers 120 through the enclosure 118.

The first hood section 114 includes a first heater 124 while the second hood section 116 includes a second heater 126 that increase the ambient temperature within the enclosure 118. The heaters 124, 126 may include heating plates or any other heater configurable/suitable for use in a glass container coating system. The introduction of heat into the enclosure can help when processing smaller containers that do not retain sufficient heat during processing to heat the enclosure 118. A conduit 128 can selectively communicate vaporized metal from a first evaporator 125 via an opening 136 in a side wall 130 (similar to the side wall 28 of FIGS. 1-3 and 4A-B) of the first hood section 114 through a top of the center section 132 of the main hood section 112 where the vaporized metal is applied to the top of glass container openings. The conduit 128 can be formed from an assembly of a conduit fan 144, a length of ducting 146, a vaporized metal source 148 located between the conduit fan 144 and the top of the center section 132, and a conduit valve 150. In addition, a second evaporator 127 can be located in the vaporized metal source 148. In FIG. 5, the side wall 134 is similar to the side wall 34 in FIGS. 1, 3, and 4A. Additionally, the side wall 131 is similar to the side wall 29 of FIGS. 1-3 and 4A-B. Any of the above features discussed with the side walls 28, 29, 34, 35 can be incorporated into the similar side walls 130, 131, 134, 135, respectively, of FIG. 5 and will not necessarily be discussed again.

Figure 6:
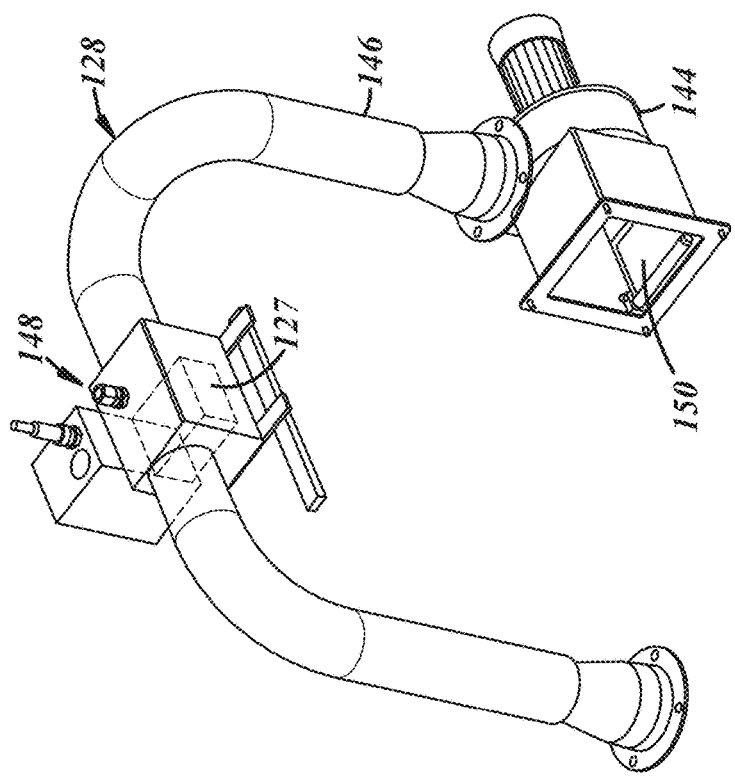
FIG. 6 is a perspective view depicting a portion of an embodiment of a vaporized metal application hood.

This is shown in FIG. 6 in more detail. The first evaporator 125 and the second evaporator 127 can be implemented like the evaporator 25 discussed above. The conduit fan 144 can include an air box within which the conduit valve 150 is located. The air box can then be attached to the opening 136 in the side wall 130. And the conduit fan 144 may optionally use VFD. Downstream from the conduit fan 144, the vaporized metal source 148 can include a metal box having the second evaporator 127 that receives the liquid to be vaporized adjacent a heating element. Locating the vaporized metal source 148 downstream from the conduit fan 144 can minimize the buildup of metal in the mechanical parts of the conduit fan 144.

Vaporized metal can be moved through the conduit 128 in response to the operation of a conduit fan 144 that draws vaporized metal from the first evaporator 125 via the side wall 130 of the first conduit section 114 and conveys the vaporized metal to the top of the center section 132 of the main hood section 112 at a location above the glass containers 120 where the vaporized metal is applied to form metal oxide on a top surface of the glass containers 120 through opening 137. The flow of vaporized metal through the conduit 128 can be controlled by the conduit valve 150. When the conduit valve 150 is closed and the first evaporator 125 and the second evaporator 127 are off, vaporized metal may not be directed to a top surface of the glass containers. However, when the conduit valve 150 is open, the first evaporator 125 and the second evaporator 127 are on, and the conduit fan 144 is operational, vaporized metal will be applied to a top surface of the glass containers. An exhaust conduit 156 can carry excess vaporized metal outside of the enclosure 118. The excess vaporized metal can be drawn from an opening 139 in a top wall 133 to a location outside of the enclosure 118 via an exhaust fan 158.

It will be appreciated that the one or more side shields illustrated in FIGS. 4A-B could be added to the equipment of FIGS. 5-6, and the side shields could direct the flow of vaporized metal in a similar manner as described above with FIGS. 4A-B. In this way, any of the conduits, fans, valves, or the like can direct the vaporized metal to either the side or the top of the glass container 20, 120.

While the hoods 10, 100 discussed herein can have additional components that will be known to one skilled in the art, the hoods 10, 100 do not necessarily contain blowers, pumps, fans, or the like positioned within the enclosure 18. Specifically, the main hood section 12 may not necessarily include any blowers that direct fluid or air from any of the incoming sources to any outgoing source. Additionally, the vaporized metal may not be injected within the main hood section 12, but rather blown in by the fans as described.

Additionally, the hoods 10, 100 direct the vaporized metal onto the glass container 20 that is a container and no longer molten glass. Thus, a temperature in the hoods 10, 100 is sufficient to vaporize the metal, but not to melt the glass container 20 into molten glass, and is in the range of 250 to 300° F., including all ranges, subranges, and values therebetween.

Figure 7:
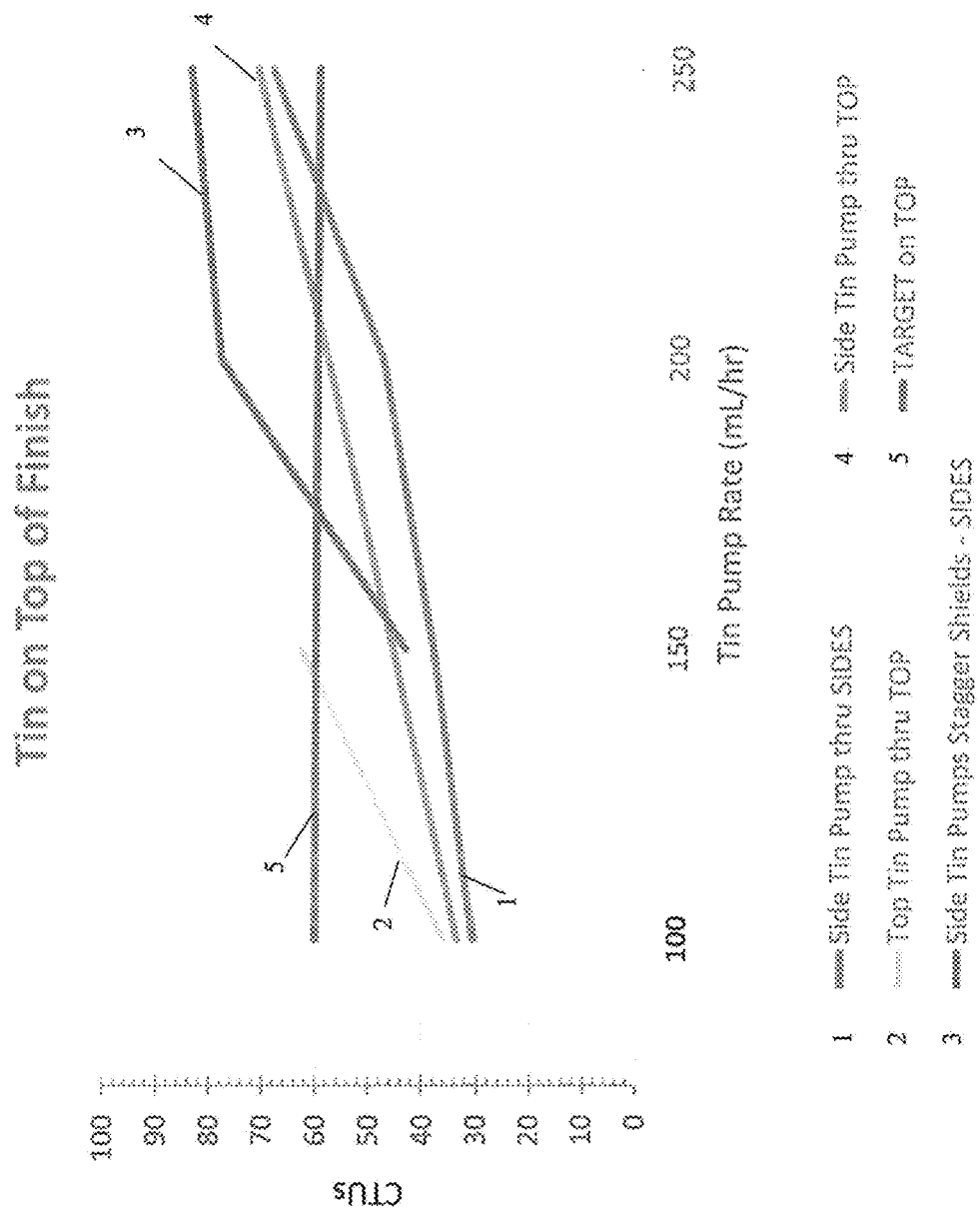
FIG. 7 is an illustrative graph depicting experimental data of vaporized tin deposited on a glass container.

FIG. 7 depicts experimental data regarding vaporized tin being deposited on the top of the neck finish. The x-axis of graph in FIG. 7 represents a vaporized tin pump rate in milliliters per hour (mL/hr). The y-axis represents an amount of vaporized tin deposited on the top of the glass container 20, 120 in Container Thickness Units (CTU). Line 5 depicts the target amount of vaporized tin to be deposited on the top of the neck finish. In FIG. 7, the target amount is approximately 60 CTU on the top of the neck finish.

In line 1, the vaporized metal application hood 10, 100 has side tin pumps, conduits, openings, bores, and/or fans that deliver the vaporized tin through the side of the hood 10, 100 and to the top of the glass container 20, 120, similar to the side fans 38, 40 that deliver the vaporized metal through the side walls 29, 35. A tin pump rate for the side tin pumps of between approximately 220 mL/hr and 240 mL/hr, including all ranges, subranges, and values therebetween, is required to achieve 60 CTU of vaporized tin on the top of the glass container 20, 120.

In line 2, the vaporized metal application hood 10, 100 utilizes top tin pumps to deliver vaporized tin to the top of the neck finish of the glass container 20, 120. The top tin pumps can be similar to the conduit fan 144 (with the vaporized metal source 148) that delivers the vaporized metal through the top of the center section 132. A tin pump rate for the conduit fan 144 of between approximately 140 mL/hr and 155 mL/hr, including all ranges, subranges, and values therebetween, is required to achieve the target tin accumulation on the top of the neck finish. In line 3, the side tin pumps as described with line 1 are used with the addition of the side shields described in FIG. 4A-B. Using the same tin pump rate for these side tin pumps can achieve a higher amount of tin on the top of the glass container 20, 120 than with the side tin pumps described with line 1. For example, while it takes a side tin pump rate of between approximately 220 mL/hr and 240 mL/hr to achieve 60 CTU of vaporized tin on the top of the glass container 20, 120 in the arrangement described with line 1, it only takes a side tin pump rate of approximately 175 mL/hr to achieve the same amount of vaporized tin on the top of the glass container 20, 120 in line 3.

In line 4, the vaporized metal application hood 10, 100 utilizes side tin pumps, as described with the arrangement with line 1, to deliver vaporized tin through the top 30 of the hood 10, 100 and to the top of the neck finish. A side tin pump rate of between approximately 190 mL/hr and 220 mL/hr is required to deliver the target tin accumulation on the top of the neck finish of the glass container 20, 120. Utilizing the top tin pumps (see line 2) delivers vaporized tin to the top of the neck finish with a lower tin pump rate than using the side tin pumps (see line 4). As can be seen, the tin pump rate is lower when the side shields are used, as depicted in line 3.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A hood for depositing vaporized metals on glass container surfaces, said hood comprising:
an enclosure, receiving one or more glass containers, and comprising a main hood section located between a first hood section and a second hood section;
said main hood section defining a container path extending from a first end of said main hood section to a second and opposite end of said main hood section, said main hood section comprising a center section plenum having a top panel located above the container path and having first and second plenum walls that extend downward from said top panel and longitudinally along said container path on opposite sides of said container path and that terminate in lower ends adapted to be above a top of the one or more glass containers on said container path;
said first and said second hood sections each having at least one side wall and being arranged parallel to said main hood and said container path, at least one of said first and said second hood sections including an evaporator and a source of a liquid metal in communication with said evaporator, said evaporator vaporizing said metal in said first or second hood section;
a first and a second vertical side shield, said first and second vertical side shields extending longitudinally along the container path and parallel to it and being spaced apart opposite each other across the container path, each having a bottom surface, wherein the bottom surface of the first vertical side shield is adapted to be above the top of the one or more glass containers on the container path so as to not impede flow of the vaporized metal towards the top of the one or more glass containers, and wherein the bottom surface of the second vertical side shield is adapted to be below the top of the one or more glass containers so as to impede the flow of the vaporized metal to allow the vaporized metal to accumulate around a neck finish of the one or more glass containers on the container path; and one or more conduits that fluidly communicate the vaporized metal to at least one opening in the top panel of the center section plenum and to at least one side wall using one or more conduit fans.

2. The hood recited in claim 1, wherein said liquid metal and said vaporized metal include tin.

3. The hood recited in claim 1, further comprising one or more heaters to increase the temperature within the enclosure.

4. The hood recited in claim 3, further comprising a first heater located in said first hood section and a second heater located in said second hood section.

5. The hood recited in claim 1, wherein the one or more conduit fans are located within the respective one or more conduits.

6. The hood recited in claim 1, further comprising one or more side fans that direct the vaporized metal toward the glass container(s) on the container path.

7. The hood recited in claim 1, further comprising two or more conduits each communicating the vaporized metal to a different opening in the top panel of the center section plenum.

8. The hood recited in claim 1, further comprising a downwardly-facing finish fan.

9. The hood recited in claim 1, wherein the one or more conduits each include a valve, wherein when said valve is closed flow of vaporized metal through said conduit is prevented.

10. The hood recited in claim 1, wherein a vaporized metal source for the center section plenum is located in-line between the conduit fan(s) and the top panel of the center section plenum such that an air flow passes from the conduit fan(s) through the vaporized metal source prior to entering the center section plenum.

11. The hood recited in claim 1, wherein the lower ends of the plenum walls are adapted to be about two inches to about four inches above the top of the one or more glass containers on the container path.

12. The hood recited in claim 11, wherein the first vertical side shield bottom surface is adapted to be approximately three inches above the top of the one or more glass containers on the container path and the second vertical side shield bottom surface is adapted to be approximately ½ inches below the top of the one or more glass containers on the container path.

13. A hood for depositing vaporized metals on glass container surfaces, said hood comprising:
- an evaporator and a source of a liquid metal in communication with said evaporator, said evaporator vaporizing said liquid metal to produce vaporized metal;
- an enclosure, receiving one or more glass containers, comprising at least one side wall and a main hood section defining a container path extending from a first end of said main hood section to a second and opposite end of said main hood section, said main hood section including a center section plenum having a top panel located above the container path and having first and second plenum walls that extend downward from said top panel and longitudinally along said container path on opposite sides of said container path and that terminate in lower ends adapted to be above a top of the one or more glass containers on said container path;
- a first and a second vertical side shield, said first and second vertical side shields extending longitudinally along the container path and parallel to it and being spaced apart opposite each other across the container path, each having a bottom surface, wherein the bottom surface of the first vertical side shield is adapted to be above the top of the one or more glass containers so as to not impede flow of the vaporized metal towards the top of the one or more glass containers, and wherein the bottom surface of the second vertical side shield is adapted to be below the top of the one or more glass containers so as to impede the flow of the vaporized metal to allow the vaporized metal to accumulate around a neck finish of the one or more glass containers on the container path;
- one or more conduits that fluidly communicate the vaporized metal to at least one opening in the top panel of the center section plenum and to the at least one side wall;
- one or more fans that direct the vaporized metal to at least one of a top surface and a side surface of the glass container(s) on the container path; and
- a downwardly-facing finish fan carried by the center section plenum of the enclosure.

14. The hood recited in claim 13, wherein said liquid metal and said vaporized metal include tin.

15. The hood recited in claim 13, further comprising one or more heaters to increase the temperature within the enclosure.

16. The hood recited in claim 13, further comprising a third and a fourth vertical side shields, said third and fourth vertical side shields extending longitudinally along the container path and parallel to it and being spaced apart opposite each other across the container path, and wherein the first and fourth vertical side shields have respective bottom surfaces that are adapted to be approximately three inches above the top of the one or more glass containers and the second and third vertical side shields have respective bottom surfaces that are adapted to be approximately ½ inches below the top of the one or more glass containers on the container path.

17. The hood recited in claim 13, wherein the enclosure further comprises a first hood section, and a second hood section, said main hood section located between said first hood section and said second hood section, said first and second hood sections being arranged parallel to said main hood and to said container path.

* * * * *